(12) United States Patent
Yeh et al.

(10) Patent No.: US 12,381,177 B2
(45) Date of Patent: Aug. 5, 2025

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Kung-Chen Yeh, Taichung (TW); Szu-Wei Lu, Hsinchu (TW); Tsung-Fu Tsai, Changhua County (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 12 days.

(21) Appl. No.: 17/857,191

(22) Filed: Jul. 5, 2022

(65) Prior Publication Data

US 2022/0336412 A1    Oct. 20, 2022

Related U.S. Application Data

(62) Division of application No. 16/888,868, filed on Jun. 1, 2020, now Pat. No. 11,508,692.

(Continued)

(51) Int. Cl.
*H01L 23/00* (2006.01)
*H01L 21/268* (2006.01)
(Continued)

(52) U.S. Cl.
CPC ............ *H01L 24/94* (2013.01); *H01L 21/268* (2013.01); *H01L 21/3043* (2013.01);
(Continued)

(58) Field of Classification Search
CPC ....... H01L 21/561; H01L 21/56; H01L 24/97; H01L 21/486; H01L 23/49827
See application file for complete search history.

(56) References Cited

U.S. PATENT DOCUMENTS

| | | |
|---|---|---|
| 5,393,711 A | 2/1995 | Biallas et al. |
| 6,573,157 B1 | 6/2003 | Sato |
| 9,000,584 B2 | 4/2015 | Lin et al. |
| 9,048,222 B2 | 6/2015 | Hung et al. |

(Continued)

FOREIGN PATENT DOCUMENTS

JP    2014007235 A   *   1/2014

OTHER PUBLICATIONS

English machine translation of JP-2014007235-A (Year: 2014).*
"Office Action of Taiwan Counterpart Application", issued on Dec. 29, 2023, p. 1-p. 3.

*Primary Examiner* — Brian Turner
(74) *Attorney, Agent, or Firm* — JCIPRNET

(57) ABSTRACT

A package structure including an interposer, at least one semiconductor die and an insulating encapsulation is provided. The interposer includes a semiconductor substrate and an interconnect structure disposed on the semiconductor substrate, the interconnect structure includes interlayer dielectric films and interconnect wirings embedded in the interlayer dielectric films, the semiconductor substrate includes a first portion and a second portion disposed on the first portion, the first interconnect structure is disposed on the second portion, and a first maximum lateral dimension of the first portion is greater than a second maximum lateral dimension of the second portion. The at least one semiconductor die is disposed over and electrically connected to the interconnect structure. The insulating encapsulation is disposed on the first portion, wherein the insulating encapsulation laterally encapsulates the least one semiconductor die and the second portion.

20 Claims, 15 Drawing Sheets

Related U.S. Application Data

(60) Provisional application No. 62/953,501, filed on Dec. 25, 2019.

(51) Int. Cl.
*H01L 21/304* (2006.01)
*H01L 21/56* (2006.01)
*H01L 21/78* (2006.01)
*H01L 23/31* (2006.01)
*H01L 23/48* (2006.01)
*H01L 25/065* (2023.01)

(52) U.S. Cl.
CPC ............ *H01L 21/561* (2013.01); *H01L 21/78* (2013.01); *H01L 23/3185* (2013.01); *H01L 23/481* (2013.01); *H01L 24/13* (2013.01); *H01L 24/97* (2013.01); *H01L 25/0652* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2005/0035100 A1* | 2/2005 | Genda | B28D 5/022 219/121.72 |
| 2006/0084241 A1* | 4/2006 | Chin | B23K 26/40 438/460 |
| 2008/0029847 A1* | 2/2008 | Guillermo | H01L 21/6836 257/E29.022 |
| 2017/0263544 A1* | 9/2017 | Hiner | H01L 21/486 |
| 2018/0190638 A1* | 7/2018 | Chen | H01L 23/3128 |
| 2018/0254250 A1* | 9/2018 | Wang | H01L 23/562 |
| 2019/0229005 A1* | 7/2019 | Tanaka | H01L 21/681 |

* cited by examiner

PACKAGE STRUCTURE AND METHOD OF FABRICATING THE SAME

CROSS-REFERENCE TO RELATED APPLICATION

This application is a divisional application of and claims the priority benefit of U.S. application Ser. No. 16/888,868, filed on Jun. 1, 2020, now allowed. The U.S. application Ser. No. 16/888,868 claims the priority benefit of U.S. provisional application Ser. No. 62/953,501, filed on Dec. 25, 2019. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, Chip-on-Wafer-on-Substrate (CoWoS) package structures are becoming increasingly popular for their multi-functions and high performance. However, there are challenges related to packaging process of the CoWoS package structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
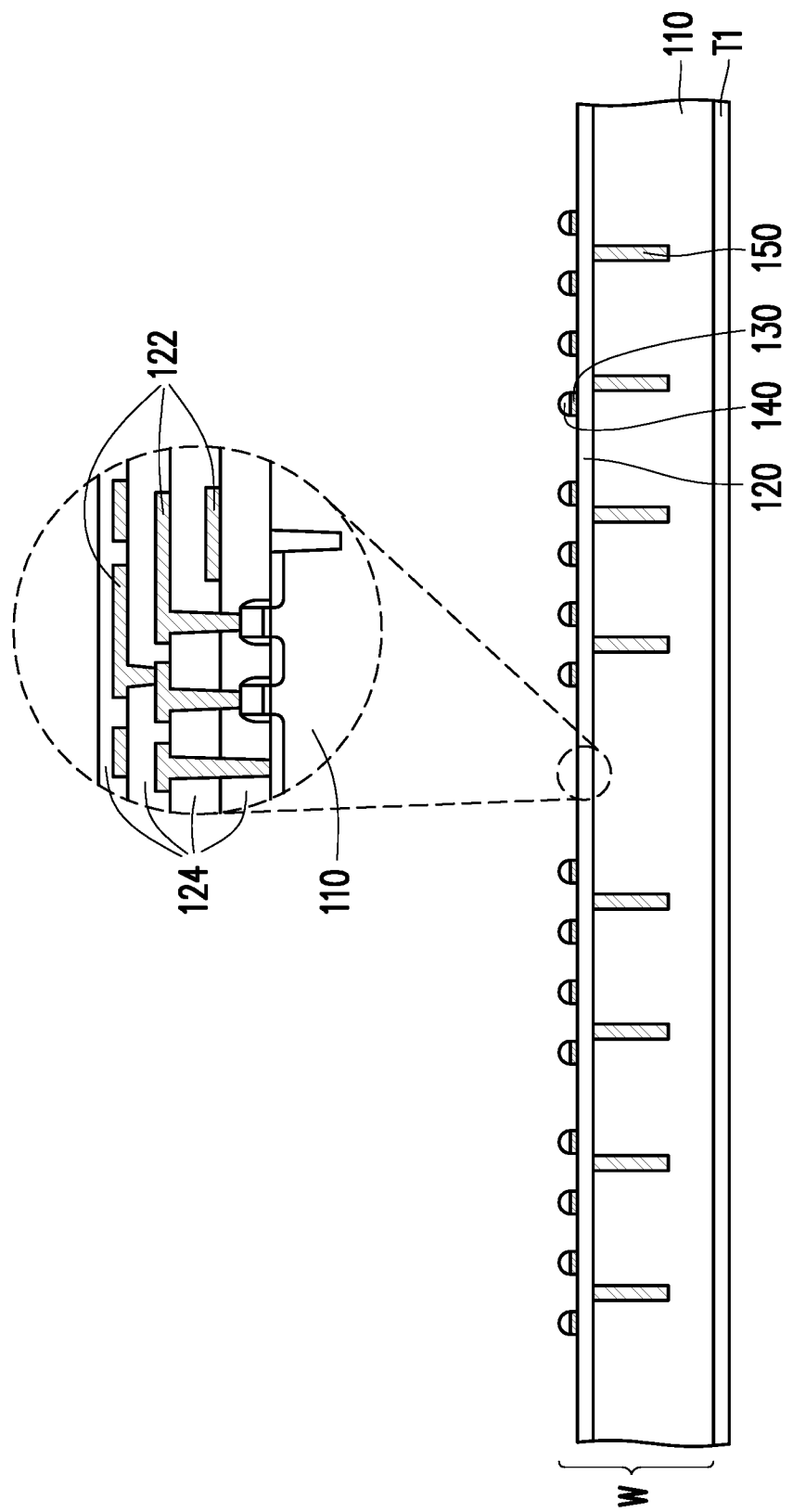
FIG. 1A through FIG. 1M are cross-sectional views schematically illustrating a process flow for fabricating Chip-on-Wafer-on-Substrate (CoWoS) package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1M are cross-sectional views schematically illustrating a process flow for fabricating Chip-on-Wafer-on-Substrate (CoWoS) package structure in accordance with some embodiments of the present disclosure. FIG. 2 is a cross-sectional view schematically illustrating forming grooves in an interposer wafer through an etching process in accordance with some other embodiments of the present disclosure.

Figure 2:
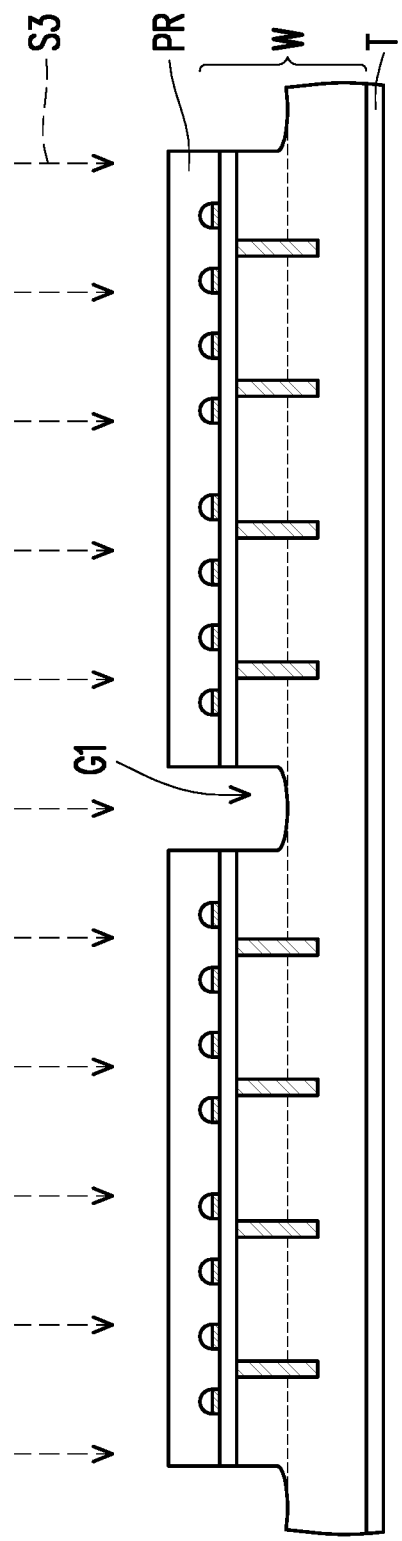
FIG. 2 is a cross-sectional view schematically illustrating forming grooves in an interposer wafer through an etching process in accordance with some other embodiments of the present disclosure.

Referring to FIG. 1A, an interposer wafer W carried by a wafer grooving tape T1 is provided. The interposer wafer W may include a semiconductor substrate 110, an interconnect structure 120 disposed on the semiconductor substrate 110, conductive vias 130 disposed on and electrically connected to the interconnect structure 120, and solder material layers 140 disposed on the conductor vias 130. The interposer wafer W may be an active interposer wafer including active components formed therein. The semiconductor substrate 110 may be a silicon substrate including active components (e.g., transistors or the like) and passive components (e.g., resistors, capacitors, inductors, or the like) formed therein. The active components and passive components may be formed in the semiconductor substrate 110 through front end of line (FEOL) fabrication processes of the interposer wafer W. The interconnect structure 120 may include interconnect wirings 122 (e.g., copper interconnect wirings) and interlayer dielectric films 124 alternately, wherein the interconnect wirings 122 are embedded in the interlayer dielectric films 124, the interconnect wirings 122 of the interconnect structure 120 are electrically connected to the active components and/or the passive components in the semiconductor substrate 110. The interconnect wirings 122 may be copper interconnect wirings or other suitable metallic wirings, and the interlayer dielectric films 124 may be silicon oxide layers, silicon nitride layers, silicon oxy-nitride layers, dielectric layers formed by other suitable low-k (i.e. dielectric constant<2.5) dielectric materials or combinations thereof. The interconnect structure 120 may be formed through back end of line (BEOL) fabrication processes of the interposer wafer W.

The conductive vias 130 may protrude from the top surface of the interconnect structure 120. In some embodiments, the conductive vias 130 include copper micro-bumps, Cu/Ni micro-bumps or the like, and the solder material layers 140 includes lead free solder material layers. For example, the solder material layers 140 may include Sn—Ag alloy layers. Furthermore, the conductive vias 130 and the solder material layers 140 may be formed over the interconnect structure 120 through one or more plating processes. In some embodiments, a seed layer (e.g., Ti/Cu seed layer) is formed on the interconnect structure 120 through a sputter process; a patterned photoresist layer is formed on the sputtered seed layer, wherein the patterned photoresist layer includes openings for exposing the sputtered seed layer; one or more plating processes are performed such that the conductive vias 130 and the solder material layers 140 are sequentially plated on the sputtered seed layer exposed by the openings defined in the patterned photoresist layer; the patterned photoresist layer is stripped; and portions of the sputtered seed layer which are not covered by the conductive vias 130 and the solder material layers 140 are removed through an etching process until the interconnect structure 120 is exposed.

In some embodiments, as illustrated in FIG. 1A, the interposer wafer W further includes through semiconductor vias (TSVs) 150, wherein the through semiconductor vias 150 are embedded in the semiconductor substrate 110 and electrically connected to the interconnect structure 120. In some alternative embodiments, not illustrated in FIG. 1A, the interposer wafer further includes through semiconductor vias, wherein the through semiconductor vias are embedded in the semiconductor substrate, electrically connected to and extend into the interconnect structure.

Figure 1B:
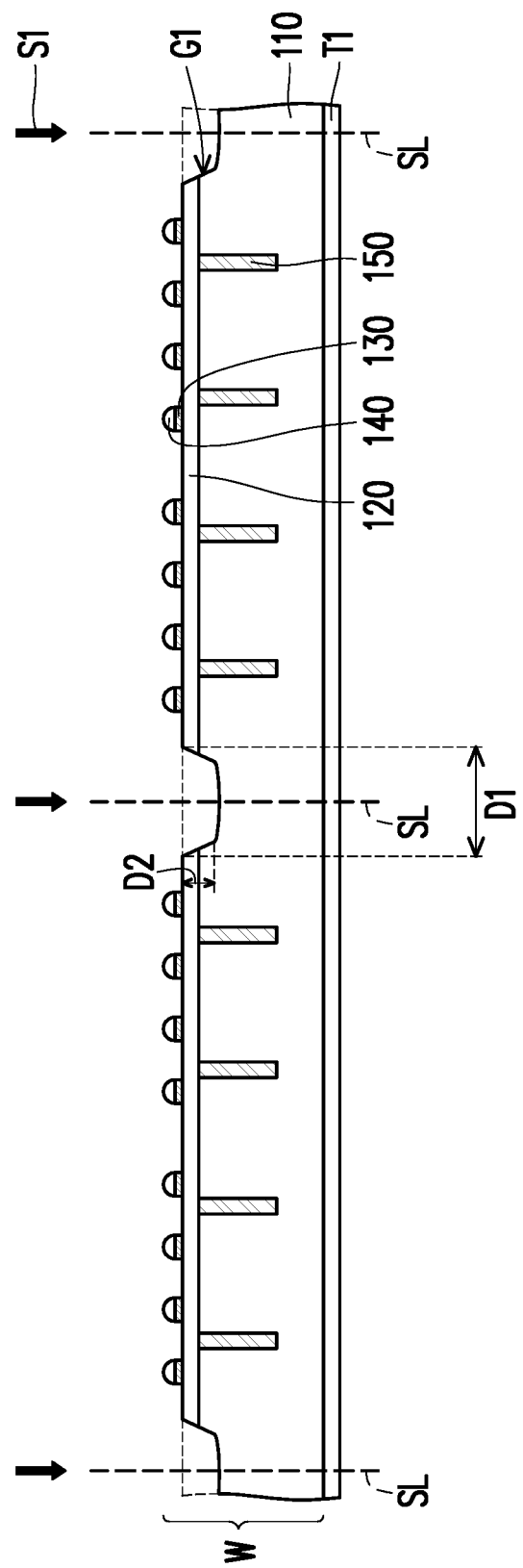

Referring to FIG. 1B, a pre-cut process S1 is performed along intersected scribe lines SL of the interposer wafer W such that intersected grooves G1 are formed on a front surface of the interposer wafer W. In some embodiments, the grooves G1 are formed through a non-contact pre-cut process (i.e. the pre-cut process S1) performed along the intersected scribe lines SL of the interposer wafer W. For example, the grooves G1 are formed through a laser grooving process performed along the intersected scribe lines SL of the interposer wafer W. The grooves G1 may extend downwardly through the interconnect structure 120, and portions of the semiconductor substrate 110 are revealed by the grooves G1. The depth of the grooves G1 may be greater than the thickness of the interconnect structure 120, and the depth of the grooves G1 may be less than the height of the through semiconductor vias 150. In some embodiments, the maximum lateral dimension D1 of the grooves G1 ranges from about 55 micrometers to about 90 micrometers, and the depth D2 of the grooves G1 ranges from about 5 micrometers to about 10 micrometers. In other words, the maximum cutting width D1 of the pre-cut process S1 ranges from about 55 micrometers to about 90 micrometers, and the cutting depth D2 of the pre-cut process S1 ranges from about 5 micrometers to about 10 micrometers.

Figure 1C:
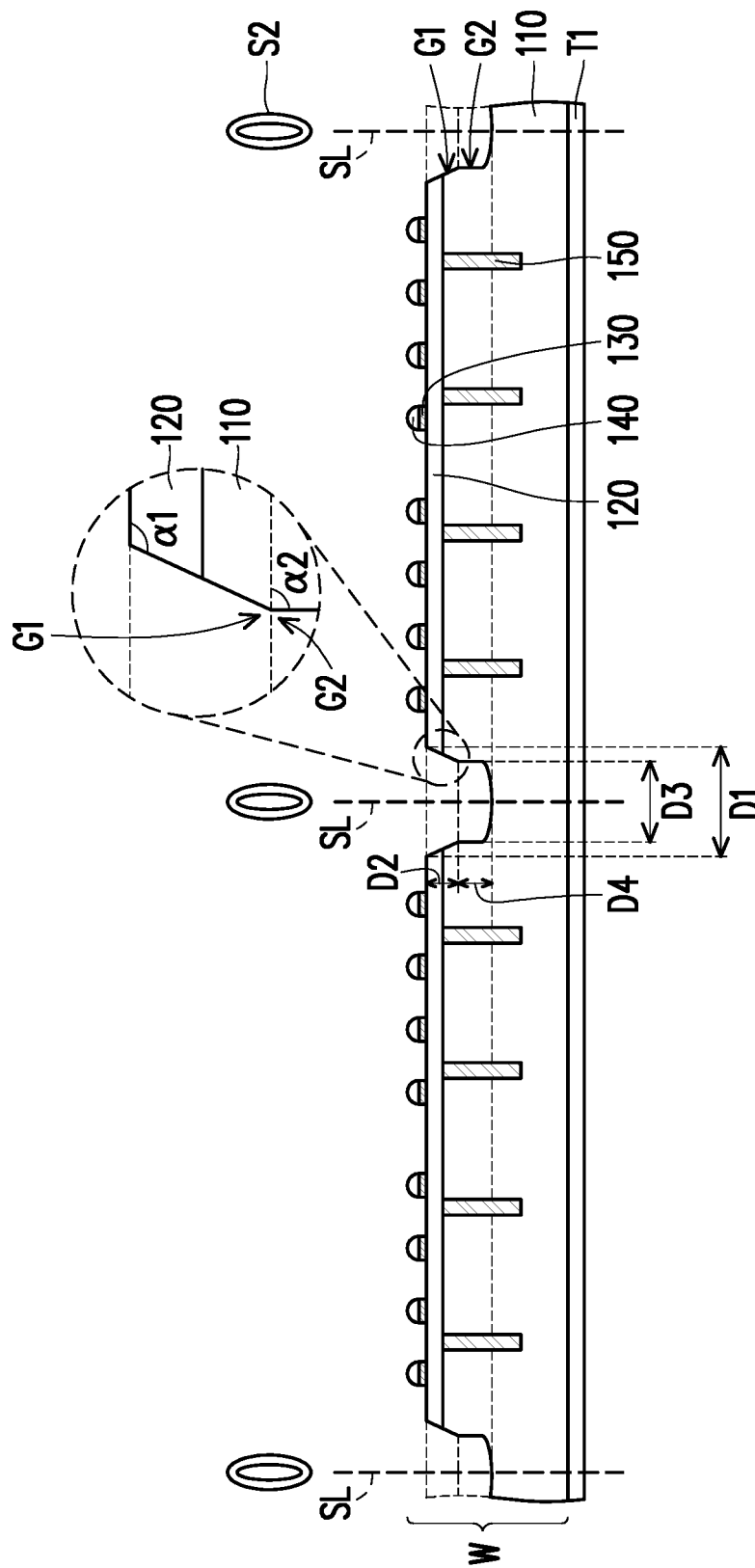

Referring to FIG. 1C, a pre-cut process S2 is performed along intersected scribe lines SL of the interposer wafer W such that intersected grooves G2 are formed on a front surface of the interposer wafer W. In some embodiments, the grooves G2 are formed through a wafer dicing process performed along the intersected scribe lines SL of the interposer wafer W. For example, a blade saw process is performed on the interposer wafer W to form the grooves G2. The grooves G2 are formed in the semiconductor substrate 110 and extend downwardly from the bottom of the grooves G1 towards a back surface of the interposer wafer W. The grooves G2 are located under the grooves G1. The sum of the depth of the grooves G1 and the depth of the grooves G2 may be less than the height of the TSVs 150 and the thickness of the semiconductor substrate 110. In some embodiments, the maximum lateral dimension D3 of the grooves G2 ranges from about 50 micrometers to about 85 micrometers, and the depth D4 of the grooves G2 ranges from about 20 micrometers to about 50 micrometers. In other words, the maximum cutting width D3 of the pre-cut process S2 ranges from about 50 micrometers to about 85 micrometers, and the cutting depth D4 of the pre-cut process S2 ranges from about 50 micrometers to about 50 micrometers. Furthermore, the sum of the depth of the grooves G1 and the depth of the grooves G2 may range from about 5 micrometers to about 50 micrometers.

As illustrated in FIG. 1C, the maximum lateral dimension D1 of the grooves G1 may be greater than the maximum lateral dimension D3 of the grooves G2, the depth of the grooves G1 may be substantially equal to the depth of the grooves G2. In some embodiments, the grooves G1 includes tapered sidewalls, and the grooves G2 include substantially vertical sidewalls. In other words, an included angle $\alpha 1$ may be greater than an included angle $\alpha 2$, the included angle $\alpha 1$ may range from about 90 degrees to about 150 degrees, and the included angle $\alpha 2$ may range from about 89.5 degrees to about 90 degrees. The included angle $\alpha 1$ may be an angle included between the tapered sidewalls of the grooves G1 and the top surface of the interconnect structure 120, and the included angle $\alpha 2$ may be an angle included between the tapered sidewalls of the grooves G2 and a virtual plane which is paralleled with the top surface of the interconnect structure 120. Each of the grooves G1 may have a top lateral dimension and a bottom lateral dimension which is less than the top lateral dimension, and the top lateral dimension of the grooves G1 equals to the maximum lateral dimension D1, and the bottom lateral dimension of the groove G1 may substantially equal to the maximum lateral dimension D3 of the grooves G2. Since the maximum cutting width D1 of the pre-cut process S1 (i.e. the maximum lateral dimension of the grooves G1) is wider than the maximum cutting width D3 of the pre-cut process S2 (i.e. the maximum lateral dimension of the grooves G2), the interconnect structure 120 of the interposer wafer W is not be in contact with the blade used in the pre-cut process S2. Accordingly, the pre-cut process S1 (i.e. the grooves G1) may protect the interconnect structure 120 of the interposer wafer W from being damaged during the pre-cut process S2, and crack issue (or chipping issue) of the interconnect structure 120 in the interposer wafer W may be prevented.

In some other embodiments, the bottom lateral dimension of the groove G1 is greater than the maximum lateral dimension D3 of the grooves G2 such that a horizontal bottom profile of the grooves G1 may be formed between the vertical sidewalls of the groove G1 and the tapered sidewalls of the grooves G2. Furthermore, the depth D2 of the grooves G1 may be greater than or less than the depth D4 of the grooves G2.

In some other embodiments, the pre-cut process S2 of the interposer wafer W is omitted. In other words, only the pre-cut process S1 is performed on the front surface of the interposer wafer W and only the grooves G1 are formed on the front surface of the interposer wafer W, as illustrated in FIG. 1B. In still some other embodiments, as illustrated in FIG. 2, the grooves G1 may be formed through an etching process S3 performed on the front surface of the interposer wafer W which is covered by a patterned photoresist layer PR. The interposer wafer W covered by the patterned photoresist layer PR may be etched by a dry etching process, a wet etching process, combinations thereof, or the like. In some alternative embodiments, the grooves G1 may be formed through an etching process (i.e. the etching process S3 as illustrate in FIG. 2), and then the grooves G2 may be formed through a wafer dicing process (i.e. the pre-cut process S2 as illustrate in FIG. 1C).

Figure 3:
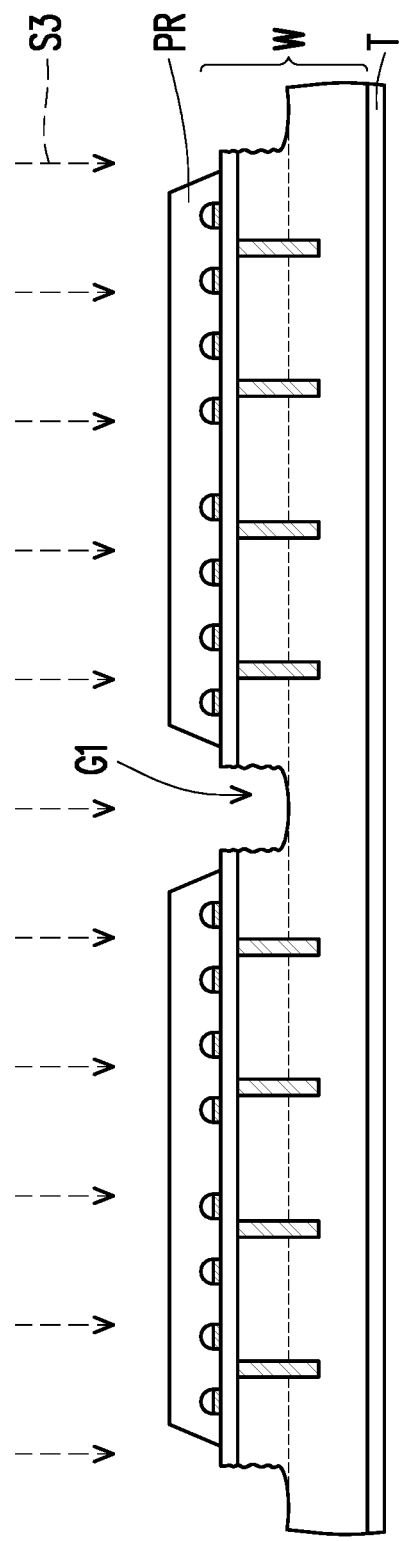
FIG. 3 is a cross-sectional view schematically illustrating forming grooves in an interposer wafer through an etching process in accordance with some alternative embodiments of the present disclosure.

FIG. 3 is a cross-sectional view schematically illustrating forming grooves in an interposer wafer through an etching process in accordance with some alternative embodiments of the present disclosure.

In some embodiments, as illustrated in FIG. 3, a plasma dicing (i.e. Bosch process) may be performed to etch the interposer wafer W. After the interposer wafer W is etched, the patterned photoresist layer PR may have tapered sidewall, portions of the interposer wafer W revealed by the patterned photoresist layer PR, and the grooves G1 may have wavy or scallop sidewalls SW resulted from the plasma dicing process.

Figure 1D:
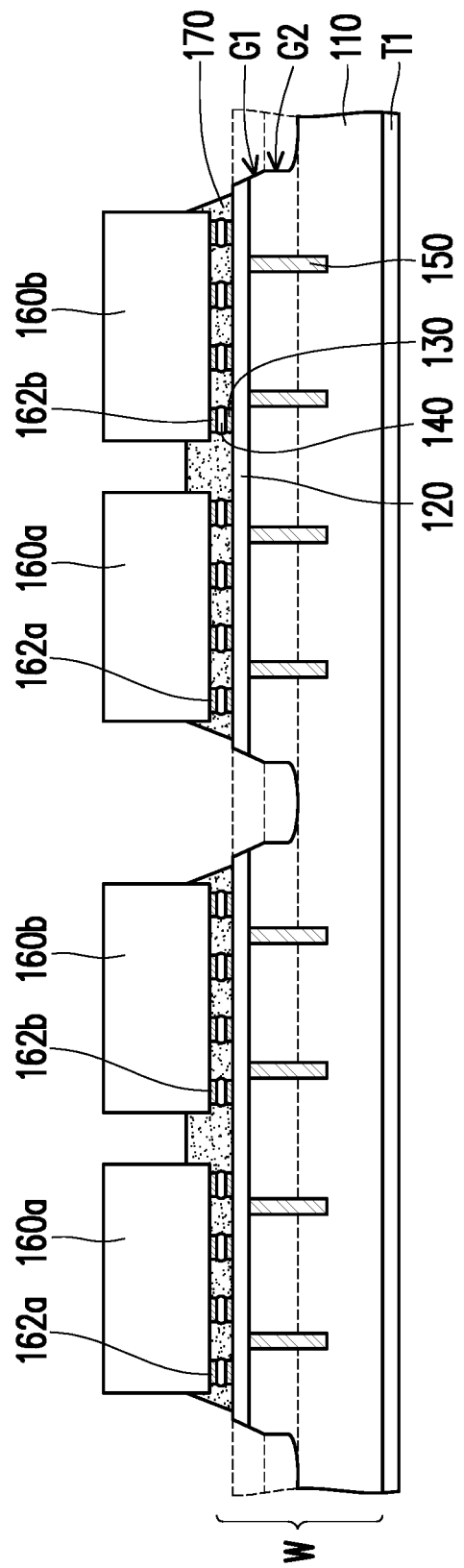

Referring to FIG. 1D, after forming the grooves G1 and the grooves G2 on the front surface of the interposer wafer W, semiconductor dies 160a and semiconductor dies 160b are provided and mounted onto the front surface of the interposer wafer W through, for example, a chip-on-wafer (CoW) bonding process. The semiconductor dies 160a and 160b are electrically connected to the interposer wafer W through bump joints. Conductive vias 162a of the semiconductor dies 160a and conductive vias 162b of the semiconductor dies 160b may be electrically connected to the conductive vias 130 through the solder material layers 140. In some embodiments, the conductive vias 130 include copper micro-bumps, Cu/Ni micro-bumps or the like, and the conductive vias 162a and 162b include copper micro-bumps, Cu/Ni micro-bumps or the like. The structure of the conductive vias 130 may be the same as or different from that of the conductive vias 160a and 160b. The semiconductor dies 160a may include logic dies, and the semiconductor dies 160b may include memory dies. In some alternative embodiments, the semiconductor dies 160a may include system-on-chip (SOC) logic dies, and the semiconductor dies 160b may include high bandwidth memory (HBM) cubes, wherein each of the HBM cubes may include stacked memory dies.

Underfills 170 may be formed over the interconnect structure 120 of the interposer wafer W. The underfills 170 are disposed between the interposer wafer W and the semiconductor dies 160a and 160b such that the solder material layers 140 and the conductive vias 130, 162a and 162b are encapsulated. The underfills 170 may serve as stress buffer to improve the reliability of the electrical connection between the conductive 130 and the conductive vias 162a and 162b.

Figure 1E:
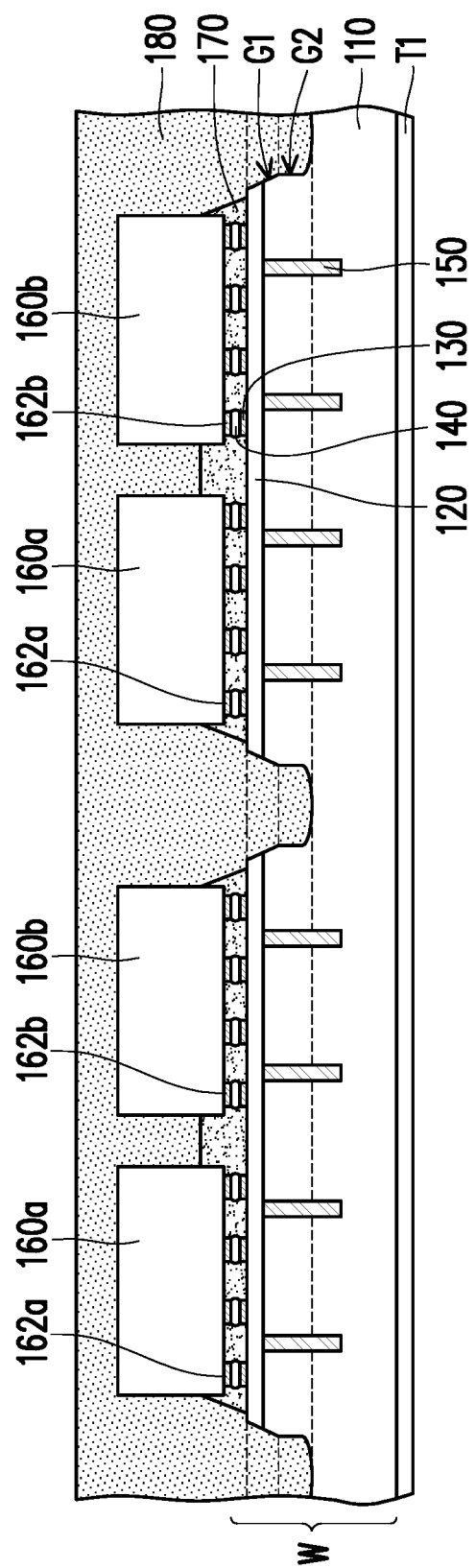
Figure 1F:
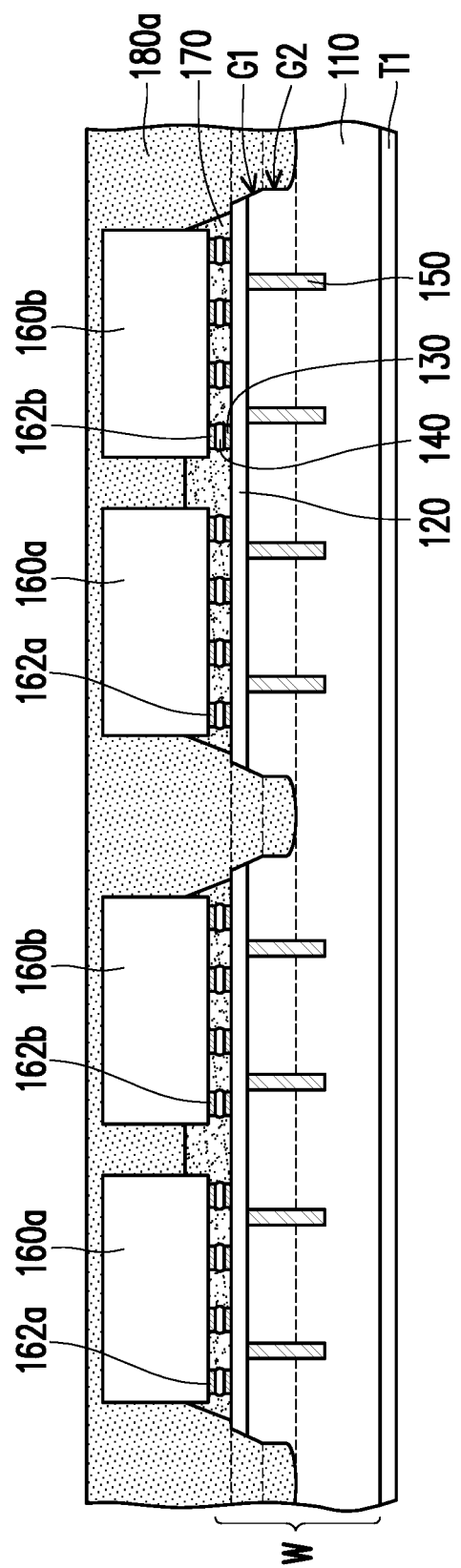

Referring to FIG. 1E and FIG. 1F, an insulating encapsulation 180 is formed on the interposer wafer W to cover the semiconductor dies 160a, the semiconductor dies 160b and the underfills 170. The insulating encapsulation 180 fills the grooves G1 and the grooves G2. The insulating encapsulation 180 may be formed by an over-molding process or a film deposition process. After performing the over-molding process or film deposition process for forming the insulating encapsulation 180, as illustrated in FIG. 1F, a first grinding process may be performed to partially remove the insulating encapsulation 180s. After performing the first grinding process, the semiconductor die 160a and 160b are covered by an insulating encapsulation 180a having reduced thickness. In some embodiments, the first grinding process includes a mechanical grinding process, a CMP process, or combinations thereof. For example, the material of the insulating encapsulation 180 and 180a includes epoxy molding compound or other suitable dielectric materials.

Figure 1G:
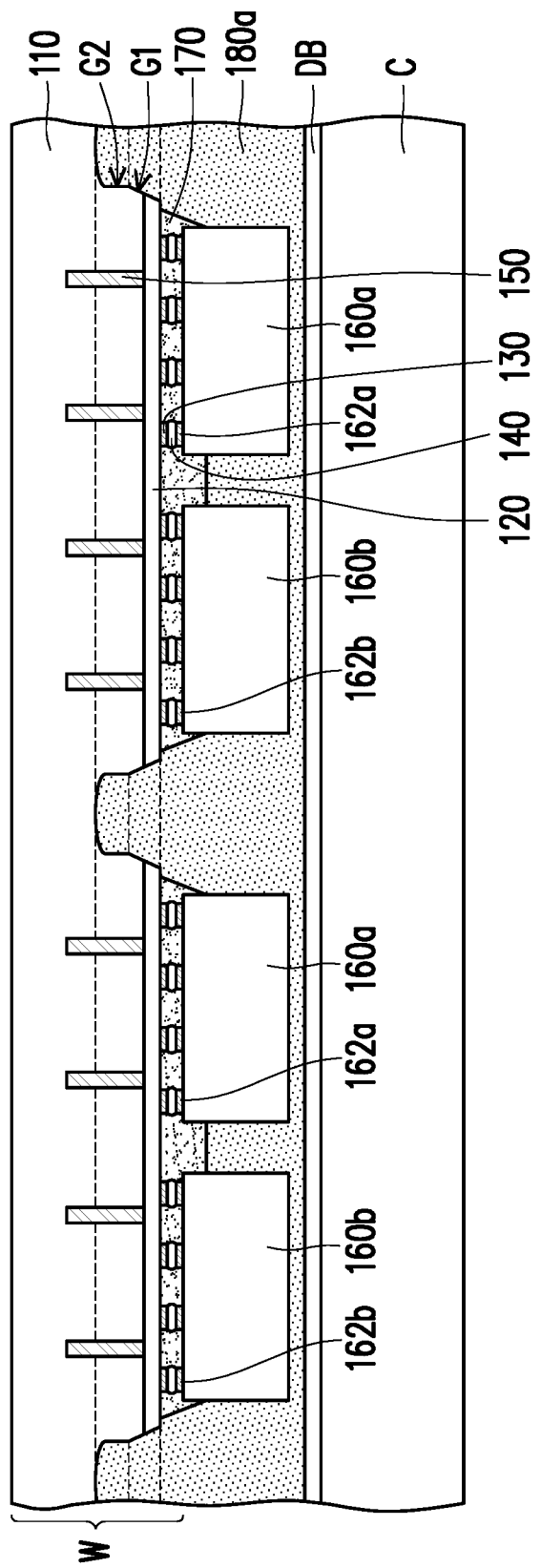

Referring to FIG. 1F and FIG. 1G, a wafer form carrier C including a de-bonding layer DB formed thereon is provided. The resulted structure illustrated in FIG. 1F is flipped upside down to mount onto the de-bonding layer DB carried by the wafer form carrier C, and the resulted structure illustrated in FIG. 1F is de-bonded from the wafer grooving tape T1. In other words, the resulted structure illustrated in FIG. 1F is transfer bonded from the wafer grooving tape T1 to the de-bonding layer DB carried by the wafer form carrier C. After transfer bonding, the insulating encapsulation 180a is attached to the de-bonding layer DB such that the back surface of the interposer wafer W may face up.

Figure 1H:
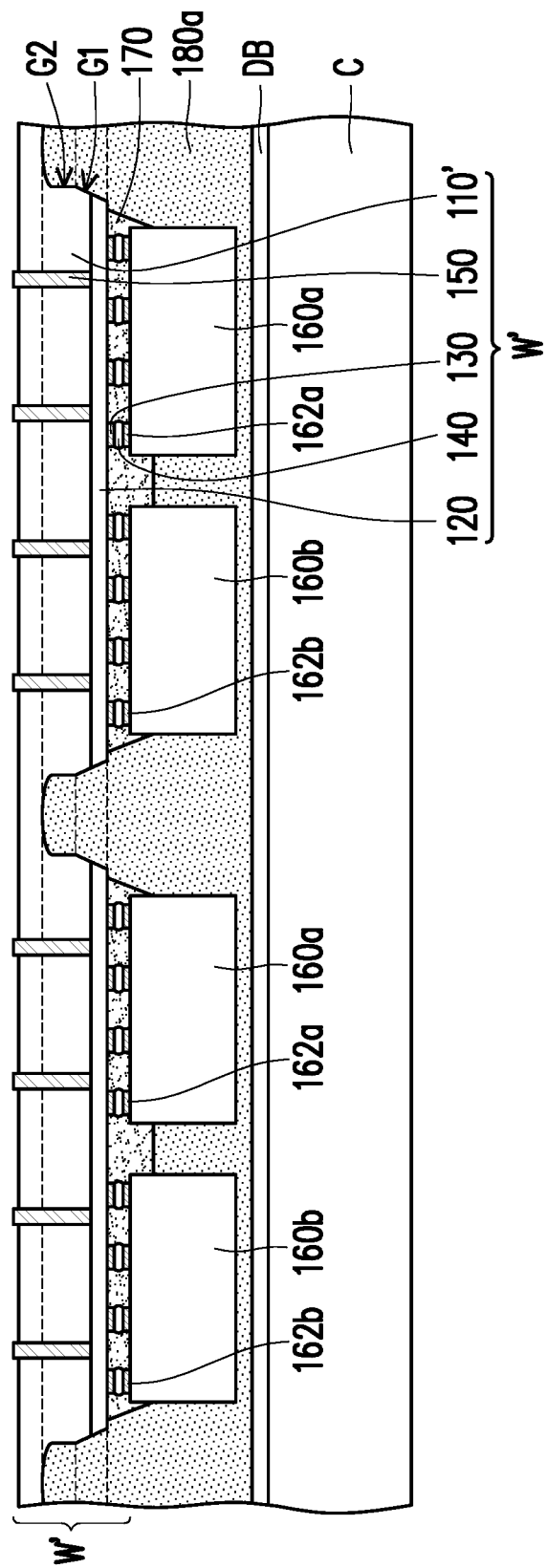

Referring to FIG. 1G and FIG. 1H, a thinning process is performed from the back surface of the interposer wafer W such that the semiconductor substrate 110 of the interposer wafer W is thinned down, and portions of the through semiconductor vias 150 are revealed at the back surface of the interposer wafer W. The semiconductor substrate 110 of the interposer wafer W may be thinned down through a mechanical grinding process, a CMP process, an etching process, combinations thereof or other suitable removal processes. After performing the thinning process, an interposer wafer W' including a semiconductor substrate 110', an interconnect structure 120, conductive vias 130, solder material layers 140 and through semiconductor vias 150 are formed. In some embodiments, the revealed surfaces of the through semiconductor vias 150 are substantially leveled with the back surface of the semiconductor substrate 110'. In some other embodiments, the revealed surfaces of the through semiconductor vias 150 are slightly lower than the back surface of the semiconductor substrate 110' due to grinding selectivity. In some alternative embodiments, the revealed surfaces of the through semiconductor vias 150 are slightly higher than the back surface of the semiconductor substrate 110' due to grinding selectivity.

Figure 1I:
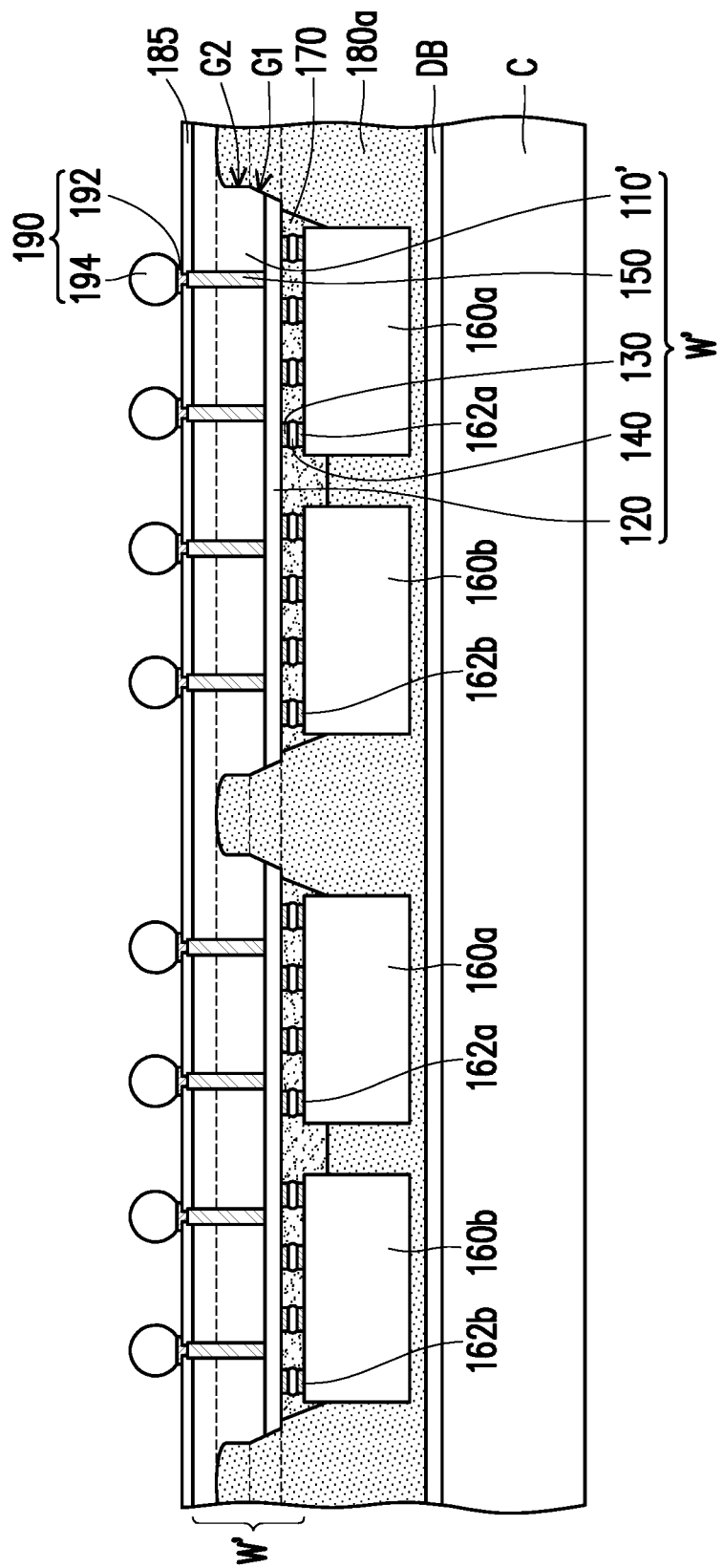

Referring to FIG. 1I, a dielectric layer 185 and conductive terminals 190 are formed on the interposer wafer W', wherein the dielectric layer 185 covers the back surface of the semiconductor substrate 110', and the conductive terminals 190 are electrically connected to the through semiconductor vias 150 penetrating through the semiconductor substrate 110'. In some embodiments, the dielectric layer 185 may include a silicon nitride layer or other suitable dielectric layer, and the conductive terminals 190 may include under bump metallization (UBM) layers 192 and controlled collapse chip connection (C4) bumps 194 landed on the UBM layers 192, wherein the UBM layers 192 are disposed between the C4 bumps 194 and the through semiconductor vias 150.

Figure 1J:
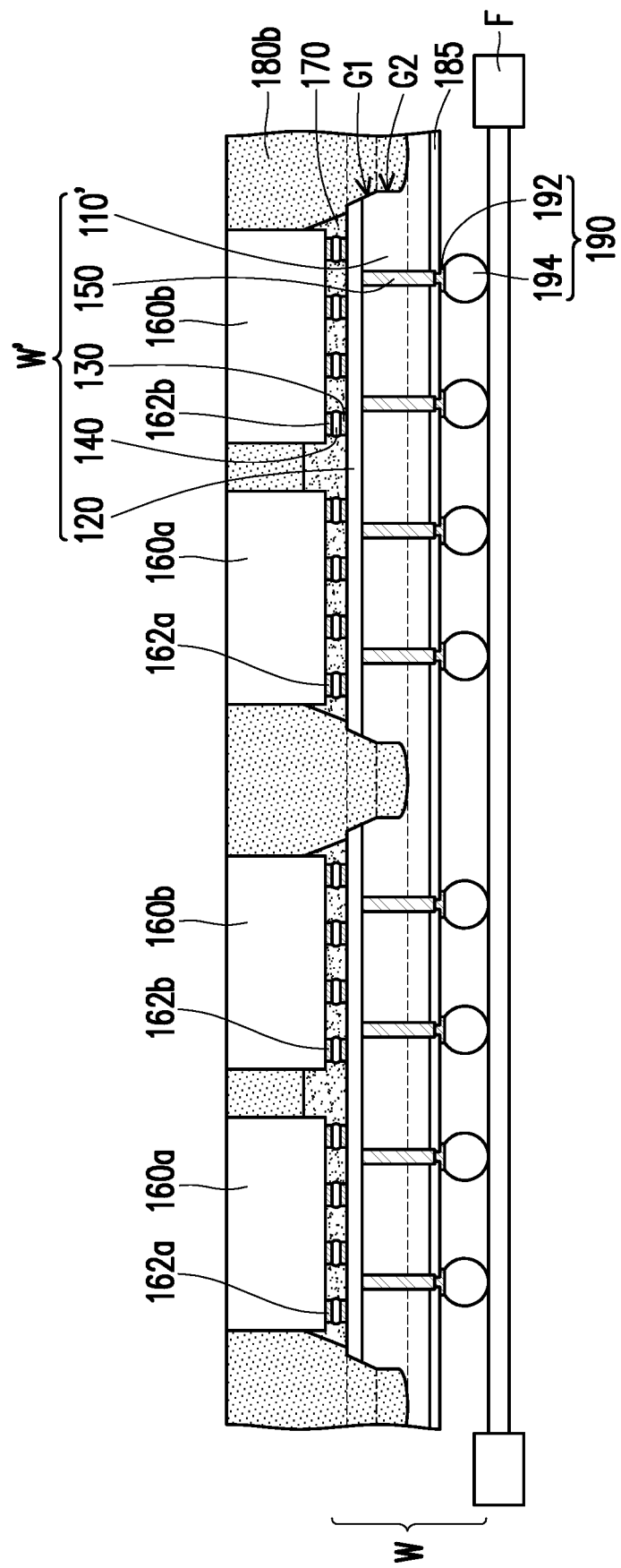

Referring to FIG. 1I and FIG. 1J, a frame mount process may be performed such that the interposer wafer W' including the dielectric layer 185 and the conductive terminals 190 formed thereon may be flipped and mounted on a frame F. During the frame mount process, the conductive terminals 190 may be attached to the frame F, and the wafer form carrier C and the de-bonding layer DB are de-bonded from the insulating encapsulation 180a. After the wafer form carrier C and the de-bonding layer DB are de-bonded from the insulating encapsulation 180a, a second grinding process may be performed to partially remove the insulating encapsulation 180a until the back surfaces of the semiconductor dies 160a and 160b are revealed. After performing the second grinding process, the semiconductor die 160a and 160b are laterally encapsulated by an insulating encapsulation 180b having reduced thickness. In some embodiments, the second grinding process includes a mechanical grinding process, a CMP process, or combinations thereof.

Figure 1K:
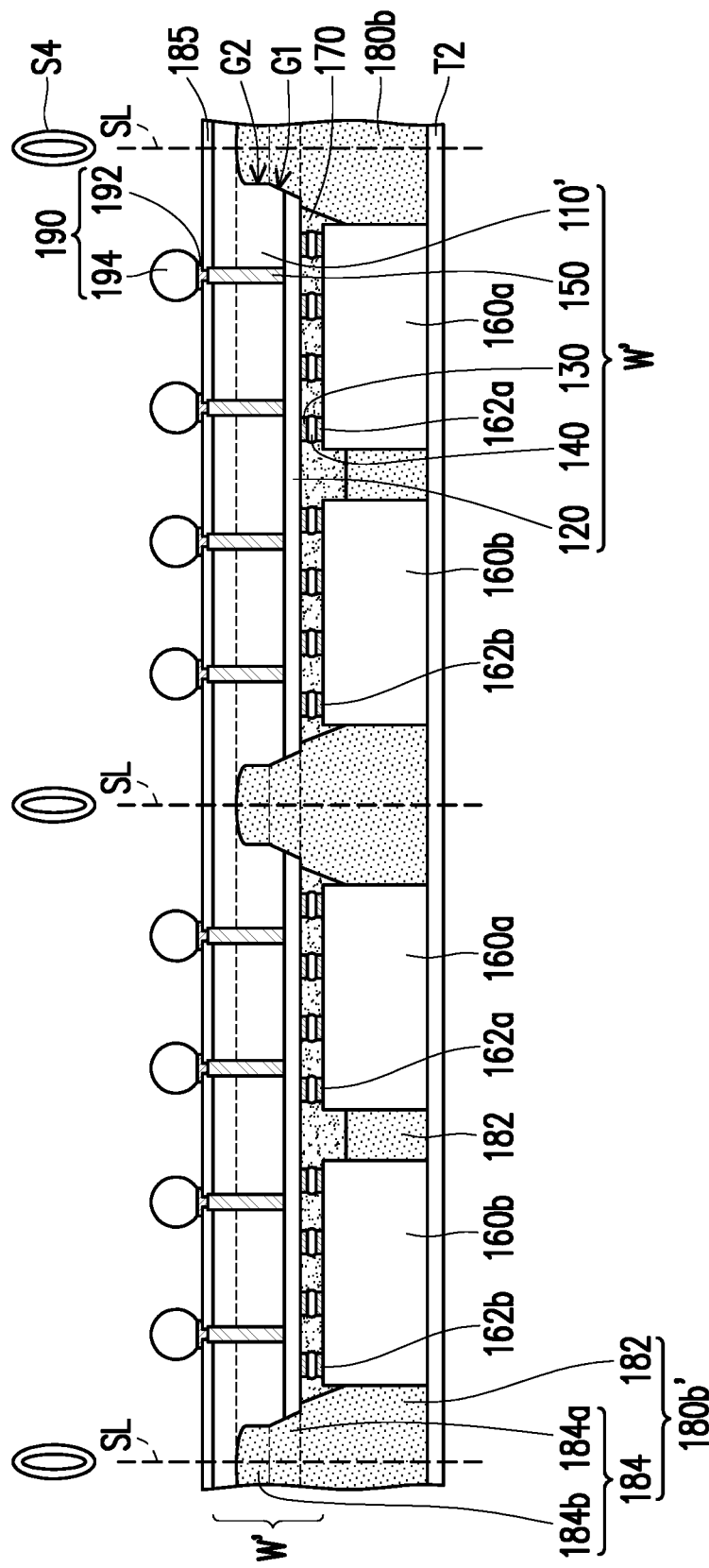
Figure 1L:
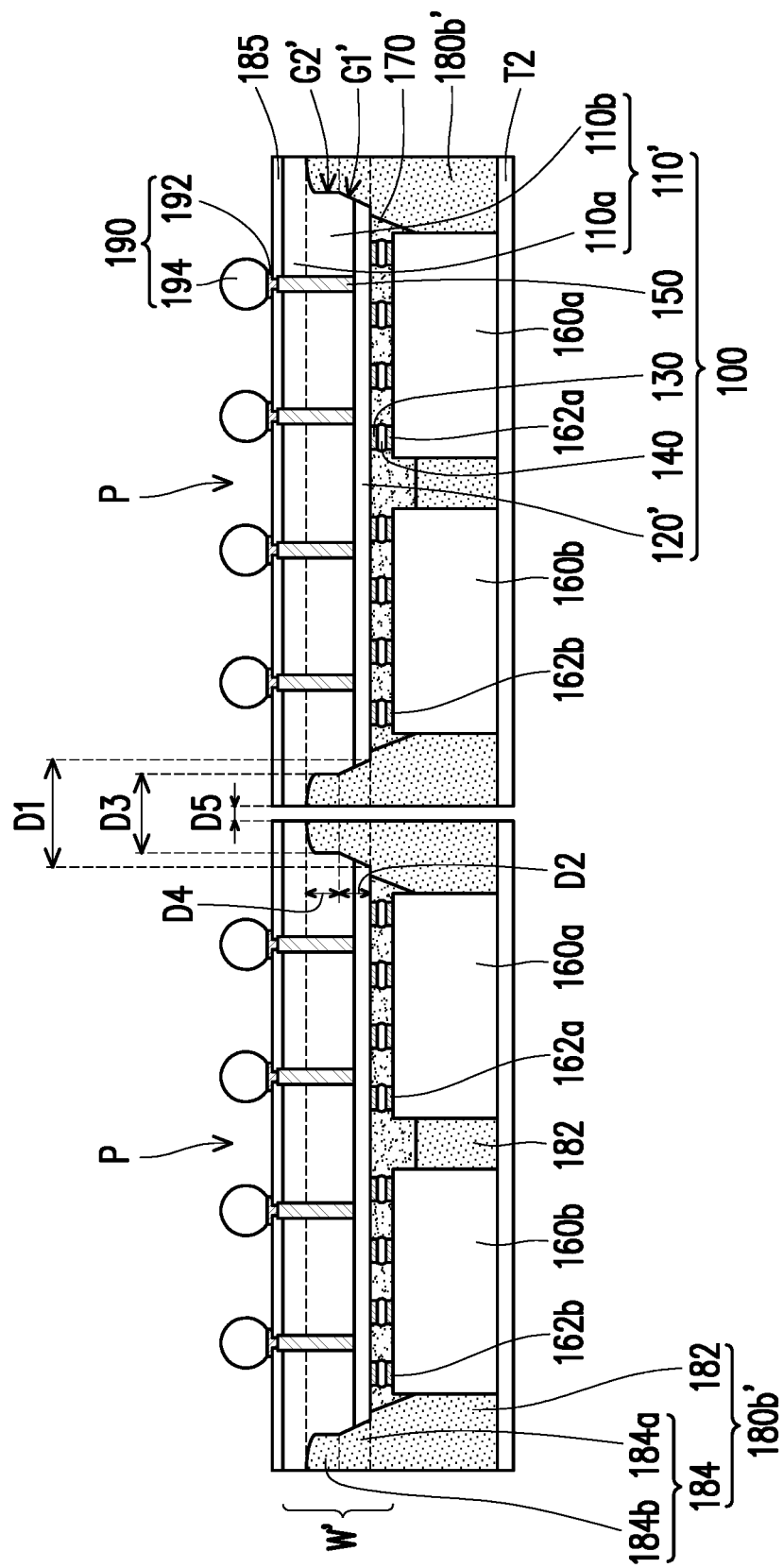

Referring to FIG. 1J, FIG. 1K and FIG. 1L, a wafer saw tape T2 is provided. The resulted structure illustrated in FIG. 1J is flipped upside down to mount onto the wafer saw tape T2, and the resulted structure illustrated in FIG. 1J is de-bonded from the frame F. In other words, the resulted structure illustrated in FIG. 1J is transfer bonded from the frame F to the wafer saw tape T2. The insulating encapsulation 180b and the back surfaces of the semiconductor dies 160a and 160b are attached to the wafer saw tape T2 such that the back surface of the interposer wafer W' may face up again.

A wafer sawing process S4 is performed from the back surface of the interposer wafer W' to saw the interposer wafer W' and the insulating encapsulation 180b. The wafer sawing process S4 is performed along the grooves G1, the grooves G2 or the intersected scribe lines SL of the interposer wafer W' so as to obtain multiple singulated package structures P. The maximum cutting width D1 of the pre-cut process S1 and the maximum cutting width D3 of the pre-cut process S2 may be wider than the maximum cutting width D5 of the wafer sawing process S4. In other words, the maximum lateral dimension D1 of the grooves G1 and the maximum lateral dimension D3 of the groove G2 (illustrated in FIG. 1J and FIG. 1K) may be wider than the maximum cutting width D5 of the wafer sawing process S4. In some embodiments, the pre-cut process S1 is a laser grooving process, the pre-cut process S2 is a wafer dicing process (i.e. a first blade saw process), and the wafer sawing process S4 is a bevel step cutting process (i.e. a second blade saw process), wherein the maximum cutting width D1 of the pre-cut process S1 (i.e. the laser grooving process) and the maximum cutting width D3 of the pre-cut process S2 are wider than the maximum cutting width D5 of the wafer sawing process S4 (i.e. the second blade saw process). Since the maximum cutting width D1 of the pre-cut process S1 (i.e. the maximum lateral dimension of the grooves G1) is wider than the maximum cutting width D3 of the pre-cut process S2 (i.e. the maximum lateral dimension of the grooves G2) and the maximum cutting width D5 of the wafer sawing process S4, the interconnect structure 120 of each singulated package structure P may not be in contact with the blade used in the pre-cut process S2 and the wafer sawing process S4. Accordingly, the pre-cut process S1 (i.e. the grooves G1) may protect the interconnect structure 120 from being damaged during the pre-cut process S2 and the wafer sawing process S4, and crack issue (or chipping issue) of the interconnect structure 120 in the package structure P may be prevented.

As illustrated in FIG. 1L, each of the package structures P may respectively include an interposer 100, semiconductor dies 160a and 160b, and an insulating encapsulation 180b'. The interposer 100 includes a semiconductor substrate 110' and an interconnect structure 120' disposed on the semiconductor substrate 110', conductive vias 130 disposed on the interconnect structure 120, solder material layers 140 and through semiconductor vias 150. The semiconductor substrate 110' of the interposer 100 may include a first portion 110a and a second portion 110b disposed on the first portion 110a, wherein the first interconnect structure 120 is disposed on the second portion 110b, and a first maximum lateral dimension of the first portion 110a is greater than a second maximum lateral dimension of the second portion 110b. The semiconductor substrate 110' may include a ring-shaped groove or recess G1' and a ring-shaped groove or recess G2' distributed in a periphery region of the interposer 100. The ring-shaped groove G1' is communicated with the ring-shaped groove G2'.

Similar to FIG. 1A, the interconnect structure 120' may include interlayer dielectric films 124 and interconnect wirings 122 embedded in the interlayer dielectric films 122. The semiconductor dies 160a and 160b are disposed over and electrically connected to the interconnect structure 120'. The insulating encapsulation 180b' is disposed on the first portion 100a of the semiconductor substrate 110', wherein the insulating encapsulation 180b' laterally encapsulates the semiconductor dies 160a and 160b and the second portion 100b of the semiconductor substrate 110'. In some embodiments, the insulating encapsulation 180b' may fill the ring-shaped groove G1' and the ring-shaped groove G2' of the interposer 100.

The insulating encapsulation 180b' may covers sidewalls of the interconnect structure 120' and sidewalls of the second portion 110b of the semiconductor substrate 110', and outer sidewalls of the insulating encapsulation 180b' are substantially aligned with sidewalls of the first portion 110a of the semiconductor substrate 110'. In some embodiments, the insulating encapsulation 180b' includes a body portion 182 and a ring portion 184, wherein the body portion 182 laterally encapsulates the semiconductor dies 160a and 160b, and the ring portion 184 extends along sidewalls of the interconnect structure 120' and the sidewalls of the second portion 110b of the semiconductor substrate 110'. In some embodiments, the semiconductor dies 160a and 160b are electrically connected to the interconnect structure 120' of the interposer 100 through bump joints. The package structure P further includes an underfill 170 disposed between the semiconductor dies 160a and 160b and the second portion 110b of the semiconductor substrate 110', wherein the first underfill 170 encapsulates the bump joints, and the bump joints are spaced apart from the insulating encapsulation 180b' by the underfill 170.

In some embodiments, the maximum lateral dimension of the ring-shaped groove G1' ranges from about 27.5 micrometers to about 45 micrometers, and the depth of the ring-shaped groove G1' ranges from about 5 micrometers to about 10 micrometers. In some embodiments, the maximum lateral dimension of the ring-shaped groove G2' ranges from about 25 micrometers to about 42.5 micrometers, and the depth of the ring-shaped groove G2' ranges from about 20 micrometers to about 50 micrometers. As illustrated in FIG. 1L, the maximum lateral dimension of the ring-shaped groove G1' may be greater than the maximum lateral dimension of the ring-shaped groove G2', the depth of the ring-shaped groove G1' may be substantially equal to the depth of the ring-shaped groove G2'. In some other embodiments, the depth of the ring-shaped groove G1' may be greater than or less than the depth of the ring-shaped groove G2'. Furthermore, the depth of the ring-shaped groove G1' may be greater than the thickness of the interconnect structure 120', and the depth of the ring-shaped groove G1' may be less than the height of the through semiconductor vias 150. The sum of the depth of the ring-shaped groove G1' and the depth of the ring-shaped groove G2' may be less than the height of the through semiconductor vias 150 and the thickness of the semiconductor substrate 110'.

The ring portion 184 may include a first ring portion 184a disposed in the ring-shaped groove G1' and a second ring portion 184b disposed in the ring-shaped groove G2'. In some embodiments, the maximum lateral dimension of the first ring portion 184a ranges from about 27.5 micrometers to about 45 micrometers, and the depth of the first ring portion 184a ranges from about 5 micrometers to about 10 micrometers. In some embodiments, the maximum lateral dimension of the second ring portion 184b ranges from about 25 micrometers to about 42.5 micrometers, and the depth of the second ring portion 184b ranges from about 20 micrometers to about 50 micrometers.

Figure 1M:
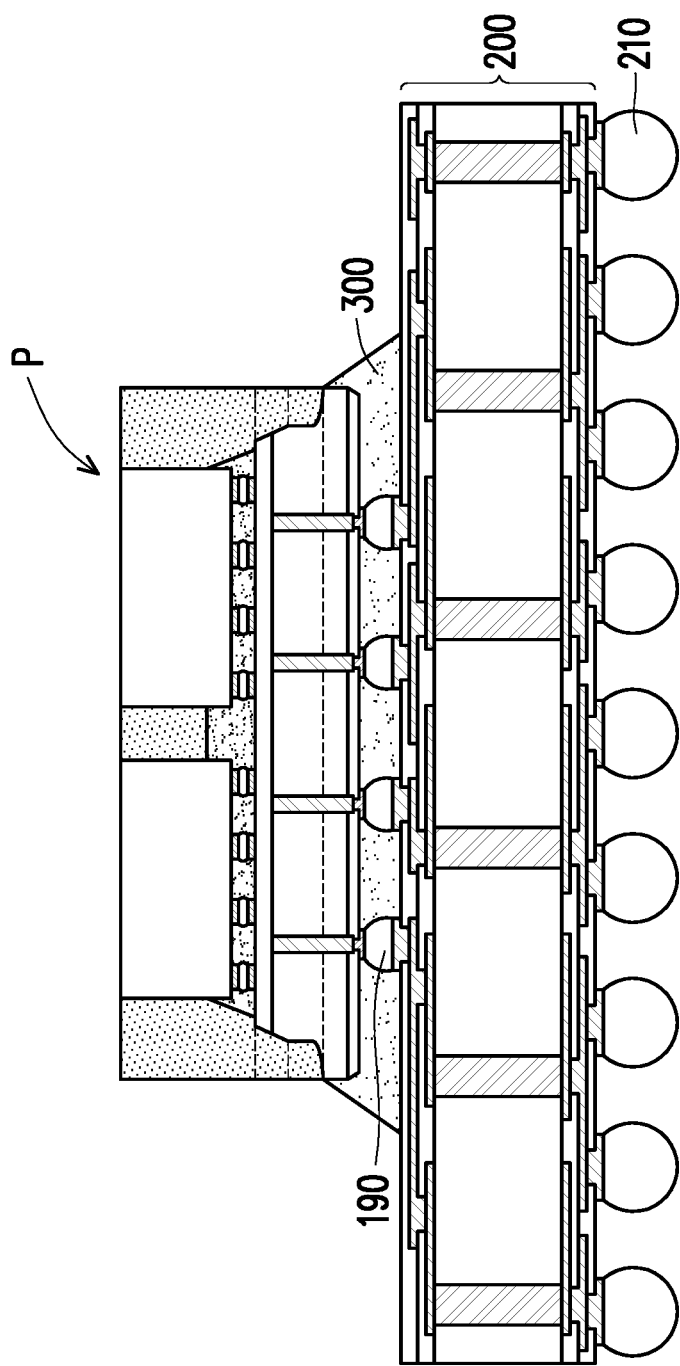

Referring to FIG. 1M, a circuit substrate 200 including conductive terminals 210 is provided. The circuit substrate 200 may be a printed circuit board, and the conductive terminals 210 may include conductive balls (e.g., BGA balls). The package structure P is mounted on and electrically connected to the circuit substrate 200 through the conductive terminals 190. In some embodiments, the package structure P further includes underfill 300, and the conductive terminals 190, the conductive terminals 190 and the conductive terminals 210 are disposed on opposite sides of the circuit substrate 200. Furthermore, the second underfill 300 is disposed between the interposer 100 and the circuit substrate 200 to encapsulate the conductive terminals 190.

As illustrated in FIG. 1L and FIG. 1M, the depth of the ring-shaped groove G1' may be greater than the thickness of the interconnect structure 120'. The ring-shaped groove G1' may have a top lateral dimension and a bottom lateral dimension which is less than the top lateral dimension. In some embodiments, the top lateral dimension of the ring-shaped groove G1' is the maximum lateral dimension of the ring-shaped groove G1', and the bottom lateral dimension of the ring-shaped groove G1' may substantially equal to the maximum lateral dimension of the ring-shaped groove G2'. In some embodiments, the ring-shaped groove G1' includes a tapered inner sidewall, and the groove G2' includes a substantially vertical sidewall. The bottom lateral dimension of the ring-shaped groove G1' may be greater than the maximum lateral dimension of the ring-shaped groove G2' such that a horizontal bottom profile of the ring-shaped groove G1' may be formed between the vertical sidewalls of the ring-shaped groove G1' and the tapered sidewalls of the ring-shaped groove G2'.

In the above-mentioned embodiments, since the interposer wafer is pre-cut through at least one a non-contact pre-cut process (e.g., a laser grooving process, an etching grooving process) followed by another wafer pre-cut process and a wafer sawing process, the interconnect structure of the interposer wafer may keep a distance from the blades used in the subsequently performed wafer pre-cut process and wafer sawing process such that the interconnect structure of the interposer wafer may not be in contact with and damaged by the blades used in the subsequently performed wafer pre-cut process and wafer sawing process. Accordingly, crack issue or chipping issue of the interconnect structure in the interposer wafer may be prevented.

In accordance with some embodiments of the disclosure, a package structure including an interposer, at least one semiconductor die and an insulating encapsulation is provided. The interposer includes a semiconductor substrate and an interconnect structure disposed on the semiconductor substrate, the interconnect structure includes interlayer dielectric films and interconnect wirings embedded in the interlayer dielectric films, the semiconductor substrate includes a first portion and a second portion disposed on the first portion, the first interconnect structure is disposed on the second portion, and a first maximum lateral dimension of the first portion is greater than a second maximum lateral dimension of the second portion. The at least one semiconductor die is disposed over and electrically connected to the interconnect structure. The insulating encapsulation is disposed on the first portion, wherein the insulating encapsulation laterally encapsulates the least one semiconductor die and the second portion. In some embodiments, the insulating encapsulation covers sidewalls of the interconnect structure and sidewalls of the second portion, and outer sidewalls of the insulating encapsulation are substantially aligned with sidewalls of the first portion. In some embodiments, the insulating encapsulation includes a body portion and a ring portion, the body portion laterally encapsulates the at least one semiconductor die, and the ring portion extends along sidewalls of the interconnect structure and the sidewalls of the second portion. In some embodiments, the at least one semiconductor die is electrically connected to the interposer through bump joints. In some embodiments, the structure further includes a first underfill disposed between the at least one semiconductor die and the second portion of the interposer, wherein the first underfill encapsulates the bump joints, and the bump joints are spaced apart from the insulating encapsulation by the first underfill. In some embodiments, the interposer further includes through semiconductor vias penetrating through the semiconductor substrate. In some embodiments, the structure further includes a circuit substrate, first conductive terminals, second conductive terminals and a second underfill. The first conductive terminals are disposed on and electrically connected to the circuit substrate. The second conductive terminals are disposed on and electrically connected to the circuit substrate, wherein the through semiconductor vias of the interposer are electrically connected to the circuit substrate through the first conductive terminals, and the first conductive terminals and the second conductive terminals are disposed on opposite sides of the circuit substrate. The second underfill is disposed between the interposer and the circuit substrate, wherein the second underfill encapsulates the first conductive terminals.

In accordance with some other embodiments of the disclosure, a package structure including an interposer, at least one semiconductor die and an insulating encapsulation is provided. The interposer includes a semiconductor substrate and an interconnect structure disposed on the semiconductor substrate, the interconnect structure includes interlayer dielectric films and interconnect wirings embedded in the interlayer dielectric films, and the semiconductor substrate includes a ring-shaped groove distributed in a periphery region of the interposer. The at least one semiconductor die is disposed over and electrically connected to the interconnect structure. The insulating encapsulation is disposed on the interposer, wherein the insulating encapsulation encapsulates the least one semiconductor die and fills the ring-shaped groove of the interposer. In some embodiments, the insulating encapsulation covers sidewalls of the interconnect structure and extends into the ring-shaped groove, and outer sidewalls of the insulating encapsulation are substantially aligned with sidewalls of the semiconductor substrate. In some embodiments, the insulating encapsulation includes a body portion and a ring portion, the body portion laterally encapsulates the at least one semiconductor die, the ring portion covers sidewalls of the interconnect structure and fills the ring-shaped groove, and the ring portion is in contact with the semiconductor substrate. In some embodiments, the at least one semiconductor die is electrically connected to the interposer through bump joints. In some embodiments, the structure further includes a first underfill disposed between the at least one semiconductor die and the second portion of the interposer, wherein the first underfill encapsulates the bump joints, and the bump joints are spaced apart from the insulating encapsulation by the first underfill. In some embodiments, the interposer further includes through semiconductor vias penetrating through the semiconductor substrate. In some embodiments, the structure further includes a circuit substrate, first conductive terminals and second conductive terminals. The first conductive terminals are disposed on and electrically connected to the circuit substrate. The second conductive terminals are disposed on and electrically connected to the circuit substrate, wherein the through semiconductor vias of the interposer are electrically connected to the circuit substrate through the first conductive terminals, and the first conductive terminals and the second conductive terminals are disposed on opposite sides of the circuit substrate. The second underfill is disposed between the interposer and the circuit substrate, wherein the second underfill encapsulates the first conductive terminals.

In accordance with some other embodiments of the disclosure, a method including the followings is provided. An interposer wafer including a semiconductor substrate and an interconnect structure disposed on the semiconductor substrate is provided, wherein the interconnect structure includes interlayer dielectric films and interconnect wirings embedded in the interlayer dielectric films. Intersected grooves are formed on an interposer wafer, wherein the intersected grooves extend through the interconnect structure, and the semiconductor substrate is revealed by the intersected grooves. Semiconductor dies are placed to the interposer wafer including the intersected grooves formed thereon. An insulating encapsulation is formed over the interposer wafer to laterally encapsulate the semiconductor dies and fill the intersected grooves. A wafer sawing process is performed to saw the insulating encapsulation and the interposer wafer along the intersected grooves formed on the interposer wafer so as to obtain package structure, wherein a maximum lateral dimension of the grooves is wider than a cutting width of the wafer sawing process. In some embodiments, the intersected grooves are formed through a laser grooving process or an etching process, the wafer sawing process comprises a blade saw process, and a first cutting width of the laser grooving process or the etching process is wider than a second cutting width of the blade saw process. In some embodiments, the intersected grooves are formed through a laser grooving process followed by a dicing process, the dicing process comprises a blade saw process, and a first cutting width of the laser grooving process is wider than a second cutting width of the blade saw process. In some embodiments, the laser grooving process or the etching process is performed from a first surface of the semiconductor wafer on which the semiconductor dies are placed, the blade saw process is performed from a second surface of the semiconductor wafer, and the first surface is opposite to the second surface. In some embodiments, the method further includes: after forming the insulating encapsulation and prior to performing the wafer sawing process, performing a thinning process to thin down the semiconductor substrate until through semiconductor vias embedded in the semiconductor substrate are revealed; and forming conductive terminals electrically connected to the through semiconductor vias. In some embodiments, the method further includes: after performing the wafer sawing process, mounting the package structure on a circuit substrate, wherein the package structure is electrically connected to the circuit substrate through the conductive terminals; and forming an underfill between the package structure and the circuit substrate to encapsulate the conductive terminals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing an interposer wafer comprising a semiconductor substrate and an interconnect structure disposed on the semiconductor substrate, the interconnect structure comprising interlayer dielectric films and interconnect wirings embedded in the interlayer dielectric films;
   forming grooves on the interposer wafer through a non-contact pre-cut process, the grooves extending through the interconnect structure and a portion of the semiconductor substrate, and the semiconductor substrate being revealed by the grooves, wherein the non-contact pre-cut process comprises a first pre-cut process and a second pre-cut process, a cutting width of the first pre-cut process is wider than a cutting width of the second pre-cut process, the grooves comprises a first sidewall forming a substantially constant angle of inclination relative to a top surface of the interconnect structure, and a second sidewall formed substantially perpendicular to the top surface of the interconnect structure and a maximum cutting width of the second pre-cut process is substantially the same as a bottom-most lateral dimension of the first pre-cut process, and smaller than the top-most lateral dimension of the first pre-cut process;
   placing semiconductor dies to the interposer wafer comprising the grooves formed thereon;
   forming an insulating encapsulation over the interposer wafer to laterally encapsulate the semiconductor dies and fill the grooves; and
   performing a wafer sawing process to saw the insulating encapsulation and the interposer wafer along the grooves formed on the interposer wafer to obtain package structures, wherein a maximum lateral dimension of the first pre-cut process is greater than a maximum lateral dimension of the second pre-cut process, and a cutting width of the wafer sawing process is smaller than the maximum lateral dimension of the first pre-cut process and the maximum lateral dimension of the second pre-cut process.

2. The method as claimed in claim 1, wherein the grooves are formed through a laser grooving process or an etching process, the wafer sawing process comprises a blade saw process, and a first cutting width of the laser grooving process or the etching process is wider than a second cutting width of the blade saw process.

3. The method as claimed in claim 1, wherein the grooves are formed through the first pre-cut process comprising a laser grooving process followed by the second pre-cut process comprising a dicing process, the dicing process comprises a blade saw process, and a first cutting width of the laser grooving process is wider than a second cutting width of the blade saw process.

4. The method as claimed in claim 3, wherein the laser grooving process or the etching process is performed from a first surface of the interposer wafer on which the semiconductor dies are placed, the wafer sawing process is performed from a second surface of the interposer wafer, and the first surface is opposite to the second surface.

5. The method as claimed in claim 1 further comprising:
after forming the insulating encapsulation and prior to performing the wafer sawing process, performing a thinning process to thin down the semiconductor substrate until through semiconductor vias embedded in the semiconductor substrate are revealed; and
forming conductive terminals electrically connected to the through semiconductor vias.

6. The method as claimed in claim 5 further comprising:
after performing the wafer sawing process, mounting the package structures on a circuit substrate, wherein the package structures are electrically connected to the circuit substrate through the conductive terminals; and
forming an underfill between the package structures and the circuit substrate to encapsulate the conductive terminals.

7. A method, comprising:
performing a non-contact pre-cut process to form grooves on an interposer, wherein the non-contact pre-cut process comprises a first pre-cut process and a second pre-cut process, a cutting width of the first pre-cut process is wider than a cutting width of the second pre-cut process, wherein a first tapered cutting edge of the first pre-cut extends substantially linearly from a top surface of the interposer to a second cutting edge of the second pre-cut, and the second cutting edge extends partially through the interposer and is substantially perpendicular to the top surface of the interposer;
disposing semiconductor dies on the interposer;
laterally encapsulating the semiconductor dies and filling the grooves on the interposer with an insulating encapsulation; and
performing a sawing process to saw the insulating encapsulation and the interposer along the grooves to obtain singulated structures, wherein a maximum cutting width of the second pre-cut process is smaller than a maximum cutting width of the first pre-cut process located above the second pre-cut process, and greater than a cutting width of the wafer sawing process.

8. The method as claimed in claim 7, wherein the grooves are formed on the interposer through a laser grooving process or an etching process, the sawing process comprises a blade saw process, and a first cutting width of the laser grooving process or the etching process is wider than a second cutting width of the blade saw process.

9. The method as claimed in claim 8, wherein the laser grooving process or the etching process is performed from a first surface of the interposer on which the semiconductor dies are placed, the blade saw process is performed from a second surface of the interposer, and the first surface is opposite to the second surface.

10. The method as claimed in claim 7, wherein the grooves are formed through the first pre-cut process comprising a laser grooving process followed by the second pre-cut process comprising a dicing process, the dicing process comprises a blade saw process, and a first cutting width of the laser grooving process is wider than a second cutting width of the blade saw process.

11. The method as claimed in claim 10, wherein the laser grooving process and the dicing process are performed from a surface of the interposer on which the semiconductor dies are placed.

12. The method as claimed in claim 7 further comprising:
after forming the insulating encapsulation and prior to performing the sawing process, performing a thinning process to thin down the interposer; and
forming conductive terminals electrically connected to the interposer.

13. The method as claimed in claim 12 further comprising:
after performing the sawing process, mounting the singulated structures on a circuit substrate, wherein the singulated structures are electrically connected to the circuit substrate through the conductive terminals; and
forming an underfill between the singulated structures and the circuit substrate to encapsulate the conductive terminals.

14. A method, comprising:
performing a first pre-cut process to form first grooves on an interposer;
performing a second pre-cut process to form second grooves on the interposer, wherein the second grooves is located under the first grooves, the second grooves communicate with the first grooves, tapered sidewalls of the first grooves extend substantially linearly from a top surface of the interposer to sidewalls of the second grooves, the sidewalls of the second grooves extend partially through the interposer and are substantially perpendicular to the top surface of the interposer, a cutting width of the first pre-cut process is wider than a cutting width of the second pre-cut process and a maximum cutting width of the second pre-cut process is substantially the same as a bottom-most lateral dimension of the first grooves formed by the first pre-cut process and smaller than the top-most lateral dimension of the first grooves formed by the first pre-cut process;
disposing semiconductor dies on the interposer;
laterally encapsulating the semiconductor dies and filling the first and second grooves on the interposer with an insulating encapsulation; and
performing a sawing process to saw the insulating encapsulation and the interposer along the first and second grooves to obtain singulated structures, wherein a maximum lateral dimension of the first grooves is wider than a cutting width of the sawing process.

15. The method as claimed in claim 14, wherein the first grooves are formed on the interposer through a laser grooving process or an etching process, the sawing process comprises a blade saw process, and a first cutting width of the laser grooving process or the etching process is wider than a second cutting width of the blade saw process.

16. The method as claimed in claim 15, wherein the laser grooving process or the etching process is performed from a first surface of the interposer on which the semiconductor dies are placed, the blade saw process is performed from a second surface of the interposer, and the first surface is opposite to the second surface.

17. The method as claimed in claim 14, wherein the first grooves are formed through the first precut process comprising a laser grooving process, the second grooves are formed through the second pre-cut process comprising a dicing process, the dicing process comprises a blade saw process, a first cutting width of the laser grooving process is wider than a second cutting width of the blade saw process, the second cutting width of the laser grooving process is wider than a third cutting width of the sawing process.

18. The method as claimed in claim 17, wherein the laser grooving process and the dicing process are performed from a surface of the interposer on which the semiconductor dies are placed.

19. The method as claimed in claim 14 further comprising:
- after forming the insulating encapsulation and prior to performing the sawing process, performing a thinning process to thin down the interposer; and
- forming conductive terminals electrically connected to the interposer.

20. The method as claimed in claim 19 further comprising:
- after performing the sawing process, mounting the singulated structures on a circuit substrate, wherein the singulated structures are electrically connected to the circuit substrate through the conductive terminals; and
- forming an underfill between the singulated structures and the circuit substrate to encapsulate the conductive terminals.

* * * * *